(12) United States Patent  (10) Patent No.: US 8,316,538 B2
Bertram et al.  (45) Date of Patent: Nov. 27, 2012

(54) METHOD FOR ADAPTING AN ELECTRONIC COMPONENT FOR SURFACE MOUNTING

(75) Inventors: Pierre Bertram, Jallais (FR); Olivier Ruffenach, Poissy (FR); Georges Peyresoubes, Cholet (FR)

(73) Assignee: Thales, Neuilly sur Seine (FR)

( * ) Notice: Subject to any disclaimer, the term of this patent is extended or adjusted under 35 U.S.C. 154(b) by 590 days.

(21) Appl. No.: 12/518,244

(22) PCT Filed: Dec. 6, 2007

(86) PCT No.: PCT/EP2007/063446
§ 371 (c)(1),
(2), (4) Date: Jan. 18, 2010

(87) PCT Pub. No.: WO2008/068313
PCT Pub. Date: Jun. 12, 2008

(65) Prior Publication Data
US 2010/0115768 A1  May 13, 2010

(30) Foreign Application Priority Data
Dec. 8, 2006 (FR) ...................................... 06 10725

(51) Int. Cl.
*H01R 43/04* (2006.01)
(52) U.S. Cl. ................. 29/861; 29/827; 29/844; 29/874
(58) Field of Classification Search .................... 29/861, 29/827, 839, 843, 844, 874; 257/666, 735, 257/776, 781; 361/760, 761, 763, 765, 767, 361/807, 808, 813
See application file for complete search history.

(56) References Cited

U.S. PATENT DOCUMENTS

| 5,128,834 A | 7/1992 | Kaschke |
| 5,493,259 A * | 2/1996 | Blalock et al. ................ 333/182 |
| 5,734,196 A | 3/1998 | Horton et al. |
| 5,768,770 A * | 6/1998 | Horton et al. .................. 29/827 |

FOREIGN PATENT DOCUMENTS

DE 29901093 U1 4/1999
EP 0844811 A2 5/1998
* cited by examiner

*Primary Examiner* — Thiem Phan
(74) *Attorney, Agent, or Firm* — Stroock & Stroock & Lavan LLP

(57) ABSTRACT

The invention relates to a method for adapting an electronic component with leads that are not suited to surface mounting on an electrical circuit. The method includes a step of bending said leads. The bending step shapes the leads of said component so that they are suitable for mounting on the surface of the electrical circuit. In particular, the invention applies to electronic components such as radio frequency and microwave power transistors, marketed notably in a straight-lead version.

7 Claims, 2 Drawing Sheets

METHOD FOR ADAPTING AN ELECTRONIC COMPONENT FOR SURFACE MOUNTING

CROSS-REFERENCE TO PRIOR APPLICATION

Figure 1B:
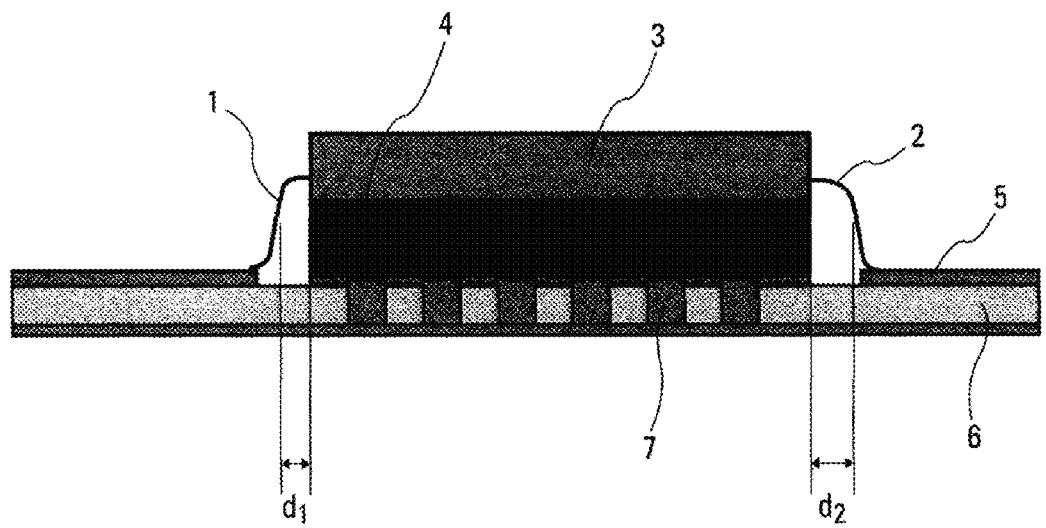

This is a U.S. National Phase Application under 35 U.S.C. §371 of International Application no. PCT/EP2007/063446, filed Dec. 6, 2007, and claims benefit of French Patent Application No. 06 10725, filed Dec. 8, 2006, both of which are incorporated herein. The International Application was published in French on Dec. 6, 2008 as WO 2008/068313 under PCT Article 21 (2).

FIELD OF THE INVENTION

The invention relates to a method for adapting an electronic component for surface mounting. In particular, the invention applies to the power electronic components (transistors, for example), marketed notably in a straight-lead version.

BACKGROUND OF THE INVENTION

Electronic components, and notably power transistors, are generally marketed in a straight-lead version. These components are suited to conventional mounting on an electronic card. A certain number of power transistors are also available in a bent-lead version, particularly suited to surface mounting. These components are generally referred to as surface-mounted components (SMC). Surface mounting is particularly advantageous in that it allows the appropriate components to be assembled automatically on their card, and consequently helps to reduce the industrialization and marketing cost.

Now, not all components are available in a bent-lead version. Few power microwave components, particularly transistors rated at over 100 W are suitable for surface mounting. Many mass-produced components are therefore not originally designed for surface mounting.

Furthermore, compared to the straight-lead versions, the performance of components (notably radio frequency and microwave components) with bent leads reduces when the usage frequency increases. In practice, the bent leads, because of their shape, impose a spurious inductance unlike the same component with straight leads. For a power transistor, this spurious inductance tends to reduce the gain and the instantaneous bandwidth of the circuit that uses it.

SUMMARY OF THE INVENTION

The subject of the invention is a method of adapting a power electronic component with leads that are not suited to surface mounting on an electrical circuit. The method comprises a step of bending said leads. The bending step shapes the leads of said component so that they are suitable for mounting on the surface of electrical circuit. The lead bending step can be performed using a tool comprising bosses with dimensions suited to the component and to the electrical circuit.

The method can comprise a step during which the shape and the desired characteristics of the leads of the component after the bending step are determined.

For each lead, the distance covered by the portion of said bent lead that is substantially parallel to the plane formed by the electrical circuit can then be determined in the step of determining the length of the leads. Said distance is chosen at least so that it is then possible to connect the lead to the electrical circuit.

In one embodiment, during the step of determining the length of the leads, the distance covered by the portion of said bent lead that is substantially parallel to the plane formed by the electrical circuit is determined so that the capacitive coupling between the lead and the component at least partially compensates the inductive effect of the bending of the lead.

In a particular embodiment, the component comprising at least one input lead and one output lead, the distance covered by the portion of the bent input lead that is substantially parallel to the plane formed by the electrical circuit is different from and less than the distance covered by the portion of the bent output lead that is substantially parallel to the plane formed by the electrical circuit.

Advantageously, the distance covered by the portion of said bent lead that is substantially parallel to the plane formed by the electrical circuit is determined so as to limit the risk of electrical flashover.

In another embodiment, on completion of or during the step of bending the leads of the component, for at least one of the leads, an insulating part is positioned between the component and the bent lead. The permittivity of the insulating part is then chosen so that the capacitive charge resulting from the distance covered by the portion of the bent lead that is substantially parallel to the plane formed by the electrical circuit and the permittivity of the insulating part at least partially compensates the inductive effect of the bending of the lead.

On completion of the step of bending the leads of the component, the insulating part can be integrated and/or replaced by a portion of the package protecting the component.

The component can be a power transistor.

Notable benefits of the invention are that it makes it possible to maximize the performance of the component produced by the implementation of the inventive method. Furthermore, the inventive method can easily be implemented in an industrial context. For this, the invention ensures good performance reproducibility over a series of components, allows a range of positioning of the component on the destination electrical circuit, limits the risk of short circuit when soldering the component, and so on.

Figure 1A:
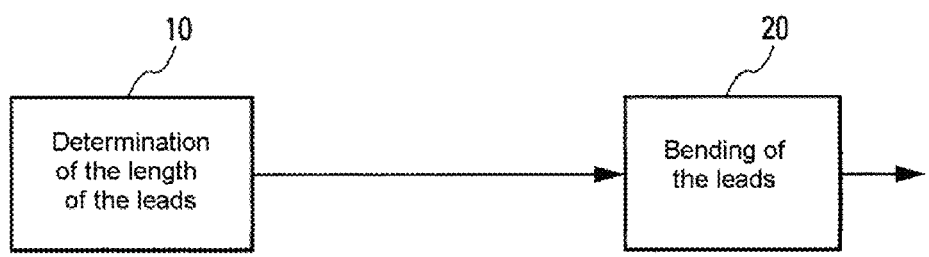
Figure 2:
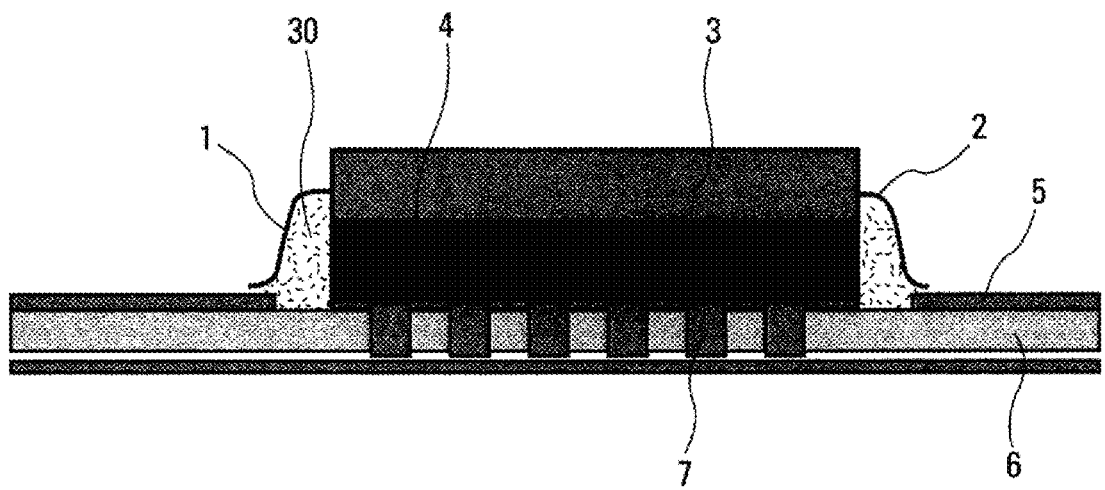
Figure 3:
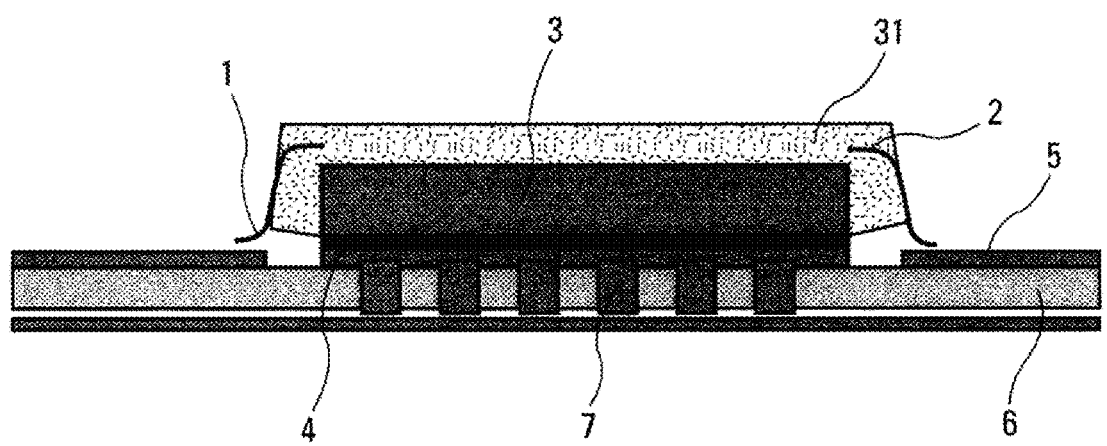

Other features and benefits of the invention will become apparent from the following description given in light of the appended drawings which represent:

FIG. 1a, by a block diagram, the steps of the inventive method of adapting an electronic component for surface mounting;

FIG. 1b, by a diagram, an optimized electronic component surface mounted on an electrical circuit, said component being obtained by the implementation of the inventive method;

FIG. 2, by a diagram, an optimized electronic component surface mounted on an electrical circuit, said component being obtained by the implementation of a variant of the inventive method;

FIG. 3, by a diagram, an optimized electronic component surface mounted on an electrical circuit, said component being obtained by the implementation of another variant of the inventive method.

DETAILED DESCRIPTION OF THE INVENTION

FIG. 1a is a block diagram illustrating the steps of the inventive method for adapting an electronic component for surface mounting. The exemplary implementation of the inventive method described hereinafter is illustrated for a power transistor with two straight leads: an input straight lead and an output straight lead. However, this example is by no means limiting, the method is suitable for any power electronic component with at least one lead that is not suited to surface mounting, such as, for example, a straight lead.

The method comprises a step 10 during which the shape and the desired dimensional characteristics of the leads of the component are determined. During this step 10, the shape and the dimensional characteristics of the leads are optimized according to different constraints. This optimization makes it possible notably to limit the performance losses that are caused by it.

The inventive method comprises a step 20 of bending the leads of the component. At the start of the step 20, the leads of the component are unsuited to surface mounting. These leads can, for example, be straight leads. The component can be any component, for example a radio frequency or microwave power transistor fitted with a standard flange.

During the step 20, the leads of the component are bent, by shaping for example. The leads are bent using, for example, a tool developed specifically for a type of component package, and possibly suited to a particular application. This tool comprises, for example, bosses with dimensions suited to the component and, if appropriate, to the target application. The dimensions and the shape of the bent leads can thus be optimized when the circuit on which the component will be mounted is designed. This tool can take the form of a press acting in collaboration with a bending template (also called matrix). The use of this tool during the step 20 ensures a particularly accurate and reproducible bend.

FIG. 1b is a diagram showing an optimized electronic component surface mounted on an electrical circuit, said component being obtained by implementing the inventive method. The component represented is a microwave power transistor 3 fitted with a standard flange 4. The transistor 3 is connected to an electrical circuit 5 positioned on a substrate 6. The transistor 3 has an input lead 1 and an output lead 2. The leads 1 and 2 electrically link the transistor 3 to the electrical circuit 5. The geometry of the leads 1 and 2 represented in FIG. 1b has been obtained by implementing the step 20 of the inventive method. Initially, the leads 1 and 2 had a geometry unsuited to surface mounting, such as, for example, a straight shape. During the step 20, the leads 1 and 2 have been shaped, and in particular, bent so that the leads 1 and 2 can be surface mounted on the circuit 5. More specifically, the input lead 1 has been warped so that the portion of the input lead 1 (once bent) that is substantially parallel to the plane formed by the electrical circuit 5 is equal to a distance d1 determined in the step 10 of determining the length of the leads. The distance d1 is chosen at least so that it is then possible to connect the input lead 1 to the electrical circuit 5. Similarly, the output lead 2 has been warped so that the portion of the output lead 2 (once bent) that is substantially parallel to the plane formed by the electrical circuit 5 is equal to a distance d2 determined in the step 10 of determining the length of the leads. The distance d2 is chosen at least so that it is then possible to connect the output lead 2 to the electrical circuit 5. More generally, for each lead of the component, the bending operation 20 and the step 10 of determining the length of the leads are carried out.

In one embodiment, the step 10 of determining the shape and dimension characteristics of the components notably establishes the distance d1 and the distance d2 so that the capacitive coupling between the leads 1 and 2 and the flange 4 of the component at least partially compensates the inductive effect of the bending of the leads (that is, the addition of an inductive element due to the elongation of the bent lead compared to a straight lead). The distance d1 is therefore chosen in the step 10 so that the capacitive charge resulting from the distance d1 and from the medium/support (in this case, air) separating the flange of the package from said lead at least partially compensates the inductive effect of the bending of the leads 1, 2. Similarly, the distance d2 is chosen in the step 10 so that the capacitive charge resulting from the distance d2 and from the medium/support (in this case, air) separating the package from said lead at least partially compensates the inductive effective of the bending of the leads 1, 2. The spurious inductance Ls due to the bending of a lead can be evaluated, in nanohenries, using the following empirical formula:

$$Ls=0.2*L[ln(2L/(w+t))+0.2505+(w+t)/3L],$$

with L, w and t respectively representing the length, the width and the thickness of the lead in millimeters. For example, considering a lead with a width of 12 mm and thickness of 0.15 mm (which could correspond to that of a power transistor) a spurious inductance of the order of 0.5 nH per millimeter of lead length is obtained. As a matter of fact, the extension of such a lead by 2 mm by bending would correspond to an impedance of approximately 1 ohm at 1 GHz added in series in the circuit 5.

The coupling distance, respectively d1, d2, of the lead relative to the flange of the package is reflected in a capacitance, respectively C1, C2, with a more or less high value, this value being inversely proportional to the distance, respectively d1, d2.

During the step 10 of determining the length of the leads, the distance d1 of the input lead can be chosen to be different from the distance d2. This alternative is particularly advantageous in the case where the component is a power transistor. This asymmetry makes it possible to optimize the respective coupling at the input and output of the component. In practice, the capacitive coupling produced for the input lead 1 (lead carrying a lower power electrical current than the output lead 2) can then be chosen to be greater(the distance d1 being less than the distance d2) than that produced for the output lead 2. This makes it possible to best compensate the bending effect which proves particularly critical to the input matching of a component, in particular for microwave power transistors. On the other hand, the capacitive coupling produced for the output lead 2 can be limited so as to eliminate the risk of electrical flashover, due to the presence of an electrical voltage (and of a high radio frequency power) between the output lead 2 and the flange 4, the powers and voltages in play in the output lead 2 being greater than those of the input lead 1, and the matching of the component at the output being less critical than at the input. As a matter of fact, with the bending carried out in the step 20 and calculated in the step 10 being specific to each lead 1, 2, it can be optimized in order to minimize the performance losses that it causes (gain, bandwidth, power, etc.) according to the constraints involved for each component concerned. As an example, transistors are subject to powers that are very much higher on their output than on their input (there is often a power difference by a factor of 10 to 100). Regarding high-power transistors, the output coupling capacitance is subject to voltage levels that are very much greater than that at the input of the transistor.

Because of this, it is essential to ensure that the capacitive coupling at the output of the component does not cause any "flashover" phenomenon or electrical arc between the output lead, subject to high voltage levels, and the flange of the transistor, generally linked to the ground of the circuit. The output power withstand strength of the transistor depends on many parameters such as the relative humidity of the air, the air pressure, the frequency of use of the transistor, the exact shape of the bending of the lead, and the circuit substrate and the mounting of the lead of the transistor on the circuit.

Conversely, this problem does not generally arise with respect to the input coupling capacitance. Thus, it is possible to envisage putting a stronger coupling at the input than at the output without risk, which facilitates the matching at the input of the transistor, the latter generally being more difficult to implement.

FIG. 2 is a diagram illustrating an optimized electronic component surface mounted on an electrical circuit, said component being obtained by implementing a variant of the inventive method. The elements that are identical to the elements already described in the other figures are given the same references. On completion of or during the step 20 of bending the leads of the component, an insulating part 30 is positioned between the flange 4 and the bent lead 1 and/or 2. The permittivity of the insulating part is chosen and taken into account during the step 10 of determining the length of the leads. Thus, the distances d1 and d2, and the material and the structure of the insulating part 30, are calculated in the step 10 so that the capacitive charge resulting from the distance d1 and d2 and the permittivity of the insulating part 30 at least partially compensate the inductive effect of the bending of the leads (1, 2). The capacitive coupling between the leads 1, 2 and the flange 4 of the component can thus be best maximized while keeping a greater separation between the flange 4 and the bent lead 1, 2. Performance is thus enhanced while minimizing the risks of short circuit when mounting and soldering the component and of power electrical flashover. More generally, it is possible to envisage having parts made of different dielectric materials, of permittivity respectively equal to $\epsilon_{r1}$ and $\epsilon_{r2}$, for each of the input and output coupling capacitances, so that the coupling capacitances are equal, respectively, $(\epsilon_0 \cdot \epsilon_{r1} \cdot S_1)/d1$ and $(\epsilon_0 \cdot \epsilon_{r2} \cdot S_2)/d2$, $\epsilon_0$ being the permittivity of the vacuum, $S_1$, $S_2$ being the surface area of the lead 1, 2 facing the flange 4 of the component.

FIG. 3 is a diagram illustrating an optimized electronic component surface mounted on an electrical circuit, said component being obtained by implementing a variant of the inventive method. The elements that are identical to the elements already described in the other figures are given the same references. On completion of the step 20 of bending the leads of the component, the insulating part 30 (introduced in the variant of the inventive method presented in FIG. 2) can be integrated and/or replaced by a portion of a package 31 enclosing the component. The placement of the package 31 can be done after the lead bending step 20. The package 31 can be a package made of plastic or molded ceramic. The permittivity of the package can be taken into account during the step 10 of determining the length of the leads. The use of the package 31 makes it possible notably to enhance the performance of surface mounting-dedicated transistors, thus making it possible to extend their use to a larger number of applications and power levels.

The invention claimed is:

1. A method for adapting a power electronic component with leads that are not suited to surface mounting on an electrical circuit, said method comprising:
   a step of bending a lead of said power electronic component to produce a bent lead that is suitable to be mounted on a surface of the electrical circuit
   a step of determining a shape and a predetermined characteristic that the lead of the power electronic component will have after the step of bending the lead; and
   a step of determining a length of a portion of said bent lead that is substantially parallel to a plane formed by the electrical circuit, such that the lead is connectable to the electrical circuit;
   wherein the length of the portion of said bent lead that is substantially parallel to the plane formed by the electrical circuit is determined such that a capacitive coupling between the lead and the power electronic component at least partially compensates an inductive effect of a bend of the lead.

2. The method as claimed in claim 1, wherein the step of bending the lead is performed using a tool comprising bosses with dimensions suited to the power electronic component and to the electrical circuit.

3. The method as claimed in claim 1, the power electronic component having at least one input lead and one output lead, wherein a distance covered by a portion of a bent input lead that is substantially parallel to the plane formed by the electrical circuit is different from and less than a distance covered by a portion of a bent output lead that is substantially parallel to the plane formed by the electrical circuit.

4. The method as claimed in claim 1, wherein the distance covered by the portion of said bent lead that is substantially parallel to the plane formed by the electrical circuit is determined so as to limit a risk of electrical flashover.

5. The method as claimed in claim 1, wherein, during or after the step of bending the leads of the power electronic component, the method further comprises the step of positioning an insulating part between the power electronic component and the bent lead, wherein a permittivity of the insulating part is chosen such that a capacitive charge resulting from the distance covered by the portion of the bent lead that is substantially parallel to the plane formed by the electrical circuit and the permittivity of the insulating part at least partly compensates an inductive effect of a bend of the lead.

6. The method as claimed in claim 5, wherein, on completion of the step of bending the lead of the power electronic component, the method further comprises the step of one of integrating the insulating part and replacing the insulating part, by a portion of the package protecting the power electronic component.

7. The method as claimed in claim 1, wherein the power electronic component comprises a power transistor.

\* \* \* \* \*